(12) United States Patent
Kung et al.

(10) Patent No.: US 6,978,539 B2
(45) Date of Patent: Dec. 27, 2005

(54) METHOD FOR ATTACHING AN INTEGRATED CIRCUIT PACKAGE TO A CIRCUIT BOARD

(75) Inventors: Shao-Tsu Kung, Taipei (TW); Chen-Hua Liu, Taipei (TW)

(73) Assignee: Compal Electronics, Inc., Taipei (TW)

( * ) Notice: Subject to any disclaimer, the term of this patent is extended or adjusted under 35 U.S.C. 154(b) by 412 days.

(21) Appl. No.: 10/064,462

(22) Filed: Jul. 17, 2002

(65) Prior Publication Data

US 2004/0010911 A1    Jan. 22, 2004

(51) Int. Cl.⁷ .............................................. H05K 3/30
(52) U.S. Cl. ...................... 29/832; 29/860; 228/180.2; 228/180.21; 174/260
(58) Field of Search .................... 29/832, 834, 854, 29/860, 840, 839; 228/135–140, 179.1, 180.1, 228/180.21, 180.22, 180.2; 174/260; 257/726, 257/727, 778, 730–733; 438/108; 361/783, 361/804

(56) References Cited

U.S. PATENT DOCUMENTS

| | | | |
|---|---|---|---|
| 4,439,918 A * | 4/1984 | Carroll et al. ................ 29/840 |
| 4,498,720 A * | 2/1985 | Ichimura ................... 439/260 |
| 4,728,022 A * | 3/1988 | Jamison ..................... 228/56.3 |
| 4,750,092 A * | 6/1988 | Werther ...................... 361/783 |
| 5,186,383 A * | 2/1993 | Melton et al. ......... 228/180.22 |
| 5,400,950 A * | 3/1995 | Myers et al. .......... 228/180.22 |
| 5,743,009 A * | 4/1998 | Matsui et al. ................. 29/843 |
| 5,834,335 A * | 11/1998 | Buschbom .................. 438/107 |
| 5,978,229 A * | 11/1999 | Kim .......................... 361/760 |
| 6,142,358 A * | 11/2000 | Cohn et al. ................ 228/44.7 |
| 6,356,453 B1 * | 3/2002 | Juskey et al. ............... 361/760 |
| 6,392,887 B1 * | 5/2002 | Day et al. ................... 361/704 |
| 6,815,613 B2 * | 11/2004 | Gebauer et al. ........... 174/52.1 |

FOREIGN PATENT DOCUMENTS

JP    1999-163043    6/1999

* cited by examiner

Primary Examiner—A. Dexter Tugbang
Assistant Examiner—Terri Lynn Smith
(74) Attorney, Agent, or Firm—Winston Hsu (57) ABSTRACT

A method for attaching an IC package to a circuit board, the IC package having a plurality of electrical contacts in an arrangement having a perimeter, first positions the IC package adjacent to the circuit board. Then, electrically connects the IC package to the circuit board through the plurality of electrical contacts. The method finally, disposes at least one anchor mechanically attaching the IC package to the circuit board, the anchor disposed at a location outside of the perimeter of the plurality of electrical contacts. The type, quantity, and exact geometry of the anchors depend on the specific design parameters of the IC package and circuit board.

4 Claims, 10 Drawing Sheets

METHOD FOR ATTACHING AN INTEGRATED CIRCUIT PACKAGE TO A CIRCUIT BOARD

BACKGROUND OF INVENTION

1. Field of the Invention

The present invention relates to an integrated circuit (IC) package, and more specifically to a method for attaching an IC package to a circuit board.

2. Description of the Prior Art

An integrated circuit is typically housed inside of a package made of ceramic or composite material. The package provides mechanical, electrical, and thermal protection to the IC chip. The package has contacts to which solder balls or pins are attached to allow the IC chip to be electrically connected to a circuit board, and at the same time to provide mechanical attachment of the package to the circuit board. The solder balls or pins serve the purpose of both electrical and mechanical connection.

Figure 1:
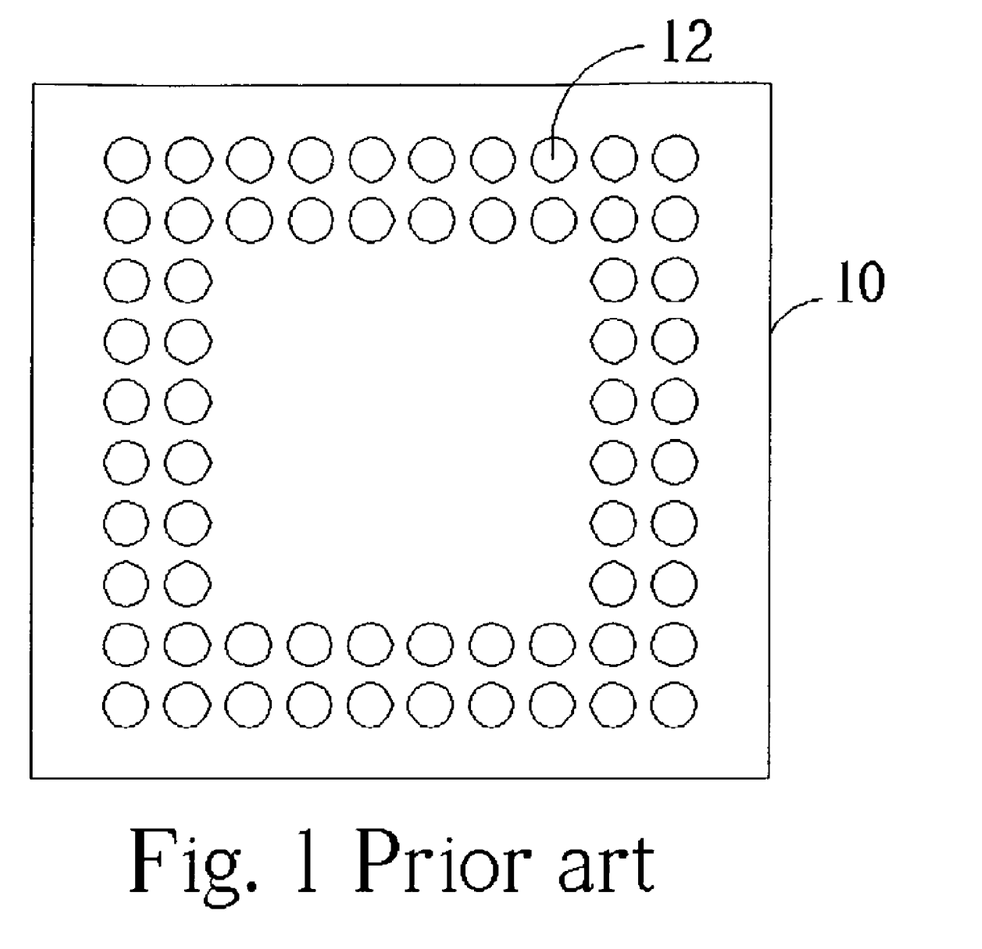
FIG. 1 is a bottom view of a prior art IC package.
Figure 2:
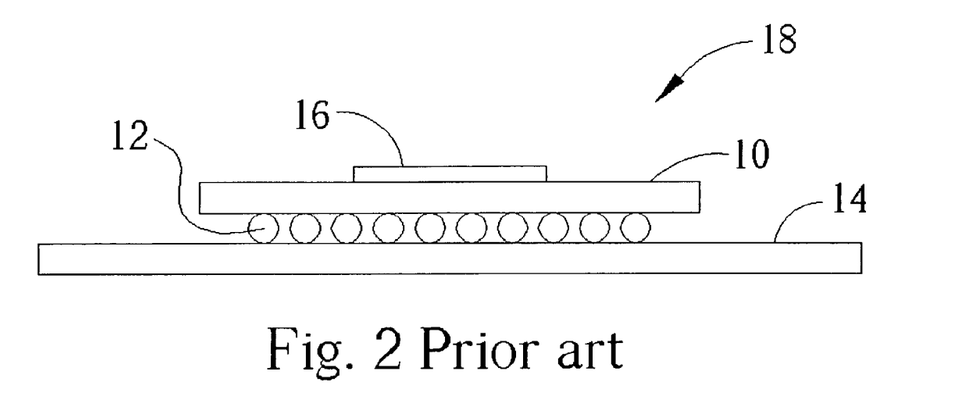
FIG. 2 is a side view showing a prior art method for attaching the IC package of FIG. 1 to a circuit board.

FIG. 1 shows a bottom view of a prior art IC package 10 having an IC chip (item 16 of FIG. 2). A plurality of solder balls 12 is disposed on a bottom surface of the package 10 in a grid-like array for attaching the package to a circuit board.

A prior art method for attaching the IC package 10 to a circuit board 14 to manufacture an assembly 18 is illustrated in a side view shown in FIG. 2. The IC package 10 holding the IC chip 16 is attached to the circuit board 14 by the plurality of solder balls 12. During manufacture, the solder balls 12 are fused to both the package 10 and the circuit board 14 to form an electrical and mechanical connection.

The solder balls 12 can fail under stress from thermally induced mechanical loading or direct mechanical loading of the assembly 18. For instance, the package 10 and circuit board 14 typically have different coefficients of thermal expansion. As the assembly 18 is heated or cooled the circuit board 14 and package 10 expand or contract at different rates, and consequently the solder balls 12 can be subject to high stresses. Additionally, the circuit board 14 can be flexed by externally applied forces, such as those forces experienced during the manufacturing, assembly, and testing processes. However, because the mechanical stiffness of the IC package 10 is appreciably greater than that of the circuit board 14, the solder balls 12 can be subject to high stresses that can also cause mechanical failure. While the principal stresses in the solder balls 12 under these loading conditions may not be enough to cause immediate failure, a cyclic mechanical or thermal load can cause a fatigue failure.

Figure 3:
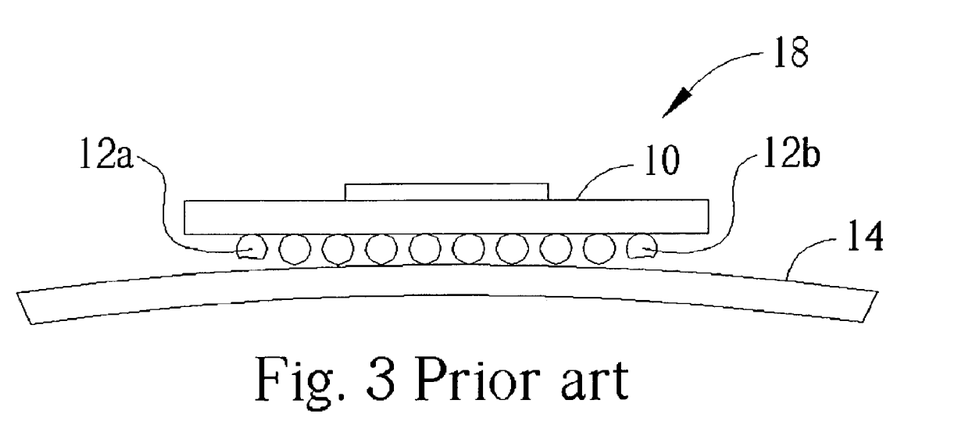
FIG. 3 is a side view of the assembly of FIG. 2 bending about a single axis.

FIG. 3 shows the assembly 18 bending about a single axis due to a differential thermal contraction of the circuit board 14 and the package 10. This condition can be caused, for example, by the assembly 18 being cooled from a higher than ambient assembly temperature resulting in the circuit-board 14 contracting more than the package 10. As the assembly 18 cooled, solder balls in two rows of solder balls 12a and 12b were subject to excessive tensile stress, and consequently cracked as shown. After a solder ball has failed mechanically, the IC package 10 is no longer effectively electrically connected to the circuit board 14. Furthermore, if the loading on the circuit board 14 is not somehow released, the package 10 may become completely mechanically separated from the circuit board 14.

The prior art method of using solder balls to provide a mechanical connection between an IC package and a circuit board results in a weak connection that is prone to mechanical failure. When the circuit board and package undergo a mechanical loading or thermally induced mechanical loading, solder balls can fail mechanically.

SUMMARY OF INVENTION

It is therefore a primary objective of the claimed invention to provide a method for attaching an IC package to a circuit board, so that the mechanical attachment strength is increased and the problems of the prior art are solved.

According to the claimed invention, a method for attaching a IC package to a circuit board, the IC package having a plurality of electrical contacts in an arrangement having a perimeter, first positions the IC package adjacent to the circuit board. Then, electrically connects the IC package to the circuit board through the plurality of electrical contacts. The method finally, disposes at least one anchor mechanically attaching the IC package to the circuit board, the anchor disposed at a location outside of the perimeter of the plurality of electrical contacts.

The type, quantity, and exact geometry of the anchors depend on the specific design parameters of the IC package and circuit board.

It is an advantage of the claimed invention that the anchors can prevent mechanical failure of the electrical connection of the IC package to the circuit board, caused by mechanical and thermally induced mechanical loading.

These and other objectives of the claimed invention will no doubt become obvious to those of ordinary skill in the art after reading the following detailed description of the preferred embodiment that is illustrated in the various figures and drawings.

DETAILED DESCRIPTION

The present invention method will be described in a preferred embodiment where four pins are used to strengthen the mechanical attachment of an IC package to a circuit board. Three alternative embodiments will also be described, wherein leads and solder are used as means for strengthening the attachment. The teachings of the present invention can apply to many modern IC package attachment systems.

Figure 4:
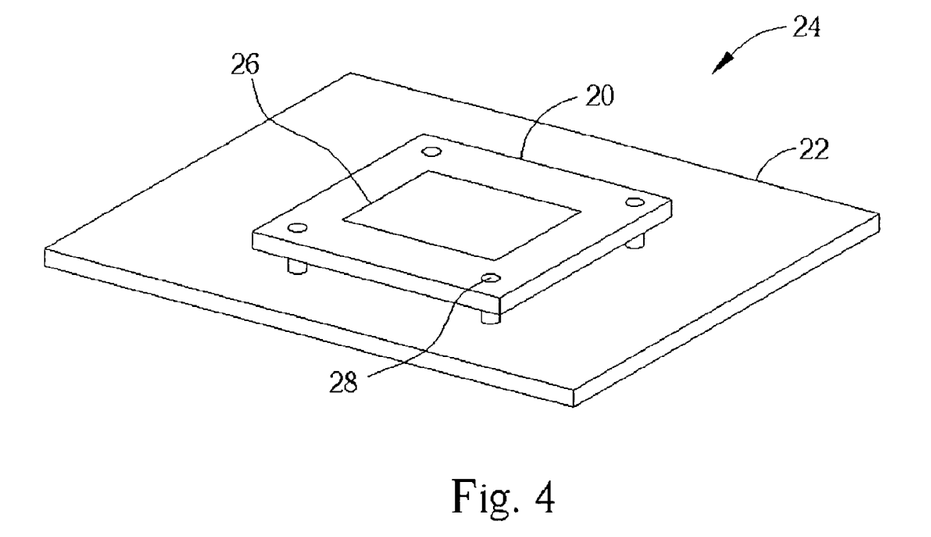
FIG. 4 is a perspective view of attaching an IC package to a circuit board according to the present invention.

A perspective view of the preferred embodiment method of attaching an IC package 20, accommodating an IC chip 26, to a circuit board 22 to manufacture an assembly 24 is shown in FIG. 4. The package 20 is first aligned with the circuit board 22. The package 20 is then electrically connected to the circuit board 22 by solder balls (item 30 of FIG. 5). The package 20 is further mechanically attached to the circuit board 22 by a group of four anchor pins 28. As the assembly 24 is manufactured, the anchor pins 28 can be produced at the same time and by the same device, as the electrically connecting solder balls. The pins 28 provide for a strengthened mechanical attachment of the package 20 to the circuit board 22.

Figure 5:
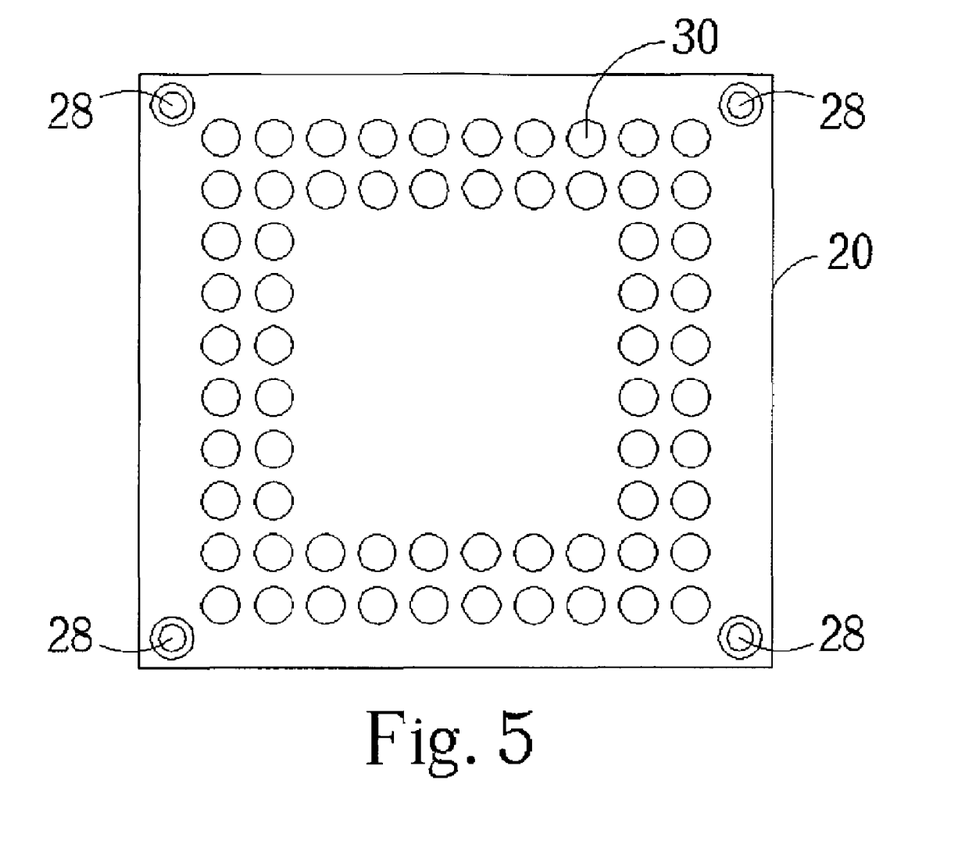
FIG. 5 is a bottom view of the IC package of FIG. 4.

FIG. 5 is a bottom view of the IC package 20 showing a plurality of solder balls 30 disposed on a bottom surface of the package 20 in a grid-like array for electrically connecting the package to a circuit board 22. Each anchor pin 28 is located at a corner of the package 20. In practical application, the anchor pins 28 are fit into holes formed in the package 20, but the anchor pins 28 could also easily be fused directly to the bottom of the package 20 to have the same anchoring effect. The anchor pins 28 are arranged at the four corners of the package 20 outside of a perimeter formed by the outmost solder balls 30, as this placement ensures that the anchor pins 28 will support a significant portion of any loading applied to the package 20 or the circuit board 22. Alternatively, the anchor pins 28 could be intermingled with the solder balls 30, but this arrangement is less desirable since the solder balls 30 are typically clustered together quite closely. The present invention is not limited by the arrangement of the solder balls 30 shown in FIG. 5. Moreover, the solder balls 30 could be pins or other means for providing electrical connections between the package 20 and the circuit board 22.

The exact diameter, length, and material of the anchor pins 28 are determined based on the precise arrangement of and material used for the solder balls 30, as well as on other design parameters. The anchor pins 28, however, do not provide an electrical connection between the IC package 20 and the circuit board 22. For the preferred embodiment described herein, the anchor pins 28 have a diameter about equal to an average diameter of the plurality of solder balls 30, and are of a material having a considerably higher allowable stress and stiffness than the material of the solder balls 30.

Figure 6:
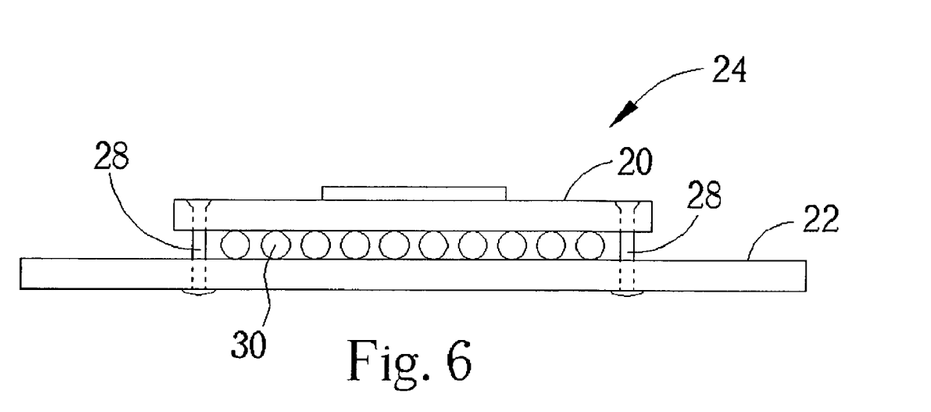
FIG. 6 is a side view of the assembly shown in FIG. 4.

A side view of the assembly 24 is shown in FIG. 6. The anchor pins 28 are illustrated penetrating both the IC package 20 and the circuit board 22. In the preferred embodiment, each anchor pin 28 has a beveled head at the package end and a non-removable flattened fastener at the circuit board end. As mentioned previously, the exact shape, size, and end connections of the pins 28 are determined at design time considering all of the necessary factors. Essentially, the pins 28 are designed to anchor the package 20 to the circuit board 22.

Also shown in FIG. 6 is the plurality of solder balls 30 providing the electrical connection of the IC package 20 to the circuit board 22, the design of such connection being well known in the art.

Figure 7:
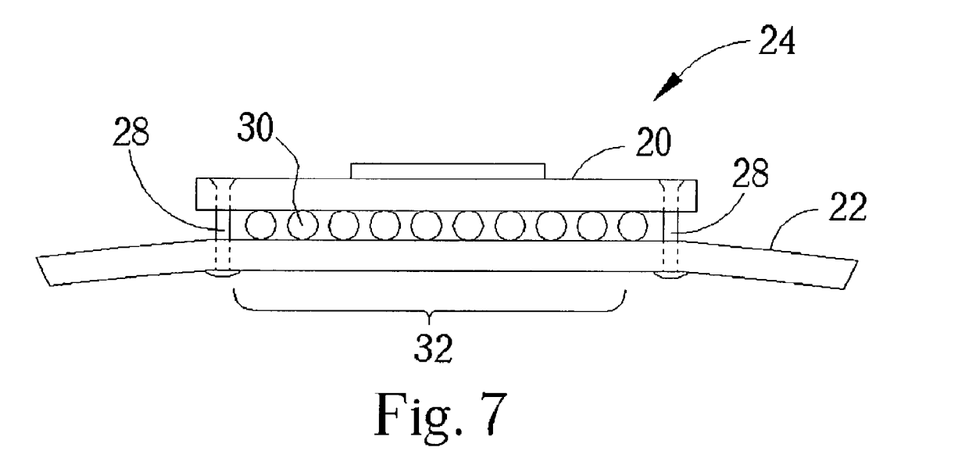
FIG. 7 is a side view of the assembly of FIG. 4 bending about a single axis.

If the assembly 24 is subject to thermally induced mechanical loading or direct mechanical loading, both of which may be simultaneous and cyclic as previously described in detail for the prior art, the assembly 24 may bend about a single axis as shown in FIG. 7. Certainly, the assembly 24 may bend about multiple axes but for the sake of clarity, only single axis bending will be addressed in the description of the preferred embodiment herein. Consideration of multiple axes of bending can be accomplished by the well-known principle of superposition. Due to a difference in coefficient of expansion, if the assembly 24 undergoes thermally induced mechanical loading, or due to a difference in stiffness, if the assembly 24 undergoes direct mechanical loading, the circuit board 22 bends significantly more than the IC package 20. Regardless of the cause of the bending, the solder balls 30 and anchor pins 28 are subject to a tensile loading. The mechanical properties of the anchor pins 28 allow them to support a substantial portion of the loading that would otherwise be taken by the solder balls 30. Note the region 32 of the circuit board 22 that is held by the anchor pins 28 to conform to the shape of the package 20. As a result, none of the solder balls 30 experiences a stress large enough to cause immediate or fatigue failure.

Figure 8:
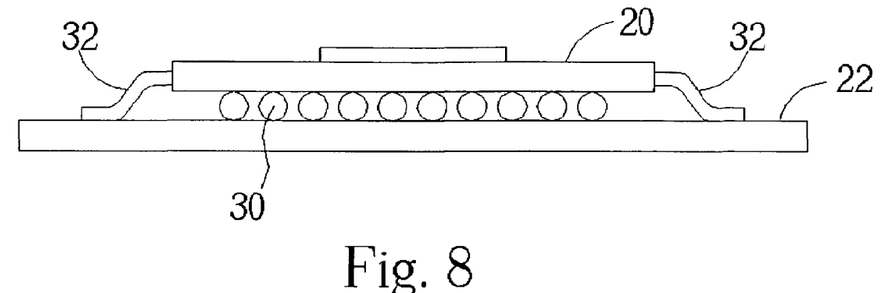
FIG. 8 is a side view of a second embodiment of the present invention.

A second embodiment of the present invention method is illustrated in FIG. 8, which shows a side view of the IC package 20 and the circuit board 22. The package 20 is anchored to the circuit board 22 by a plurality of metal straps 32. The metal straps 32 are disposed around the perimeter, on all four edges, of the IC package 20. The metal straps 32 are fused to four edges of the package 20 and the circuit board 22, and can be produced at the same time and by the same device as the electrically connecting solder balls 30. It is important to note that the metal straps 32 do not provide any electrical connection between the package 20 and the circuit board 22. The exact quantity, dimensions, placement, and material of the metal straps 32 are determined based on relevant design parameters, such as expected manufacturing or operating temperature range and external loading.

Figure 9:
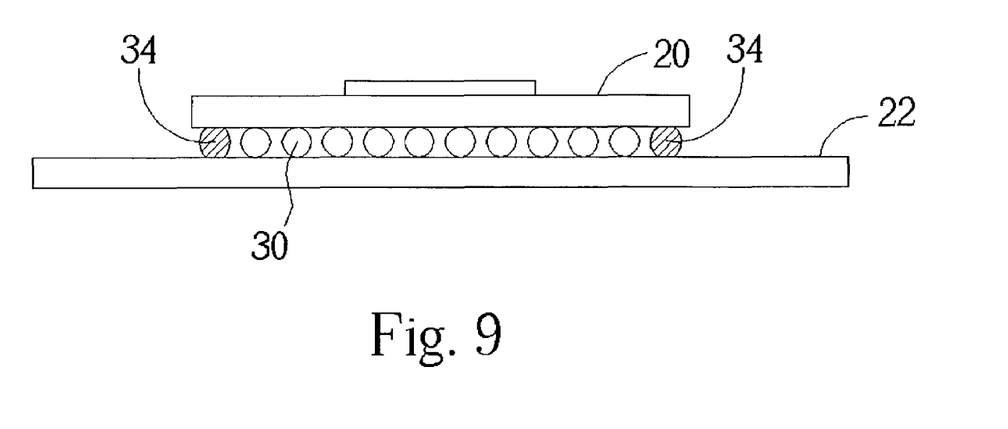
FIG. 9 is a side view of a third embodiment of the present invention.

A third embodiment of the present invention method is illustrated in FIG. 9, which shows a side view of the IC package 20 and the circuit board 22. The package 20 is anchored to the circuit board 22 by a plurality of redundant solder balls 34. The solder balls 34 are disposed at the four corners of the IC package 20. These mechanically connecting solder balls 34 are fused to the bottom of the package 20 and the circuit board 22, and can be produced at the same time and by the same device as the electrically connecting solder balls 30. As similar with the previously described embodiments, the redundant solder balls 34 do not provide any electrical connection between the package 20 and the circuit board 22. The exact quantity, diameter, placement, and material of the redundant solder balls 34 are determined based on relevant design parameters, such as expected manufacturing or operating temperature range and external loading.

Figure 10:
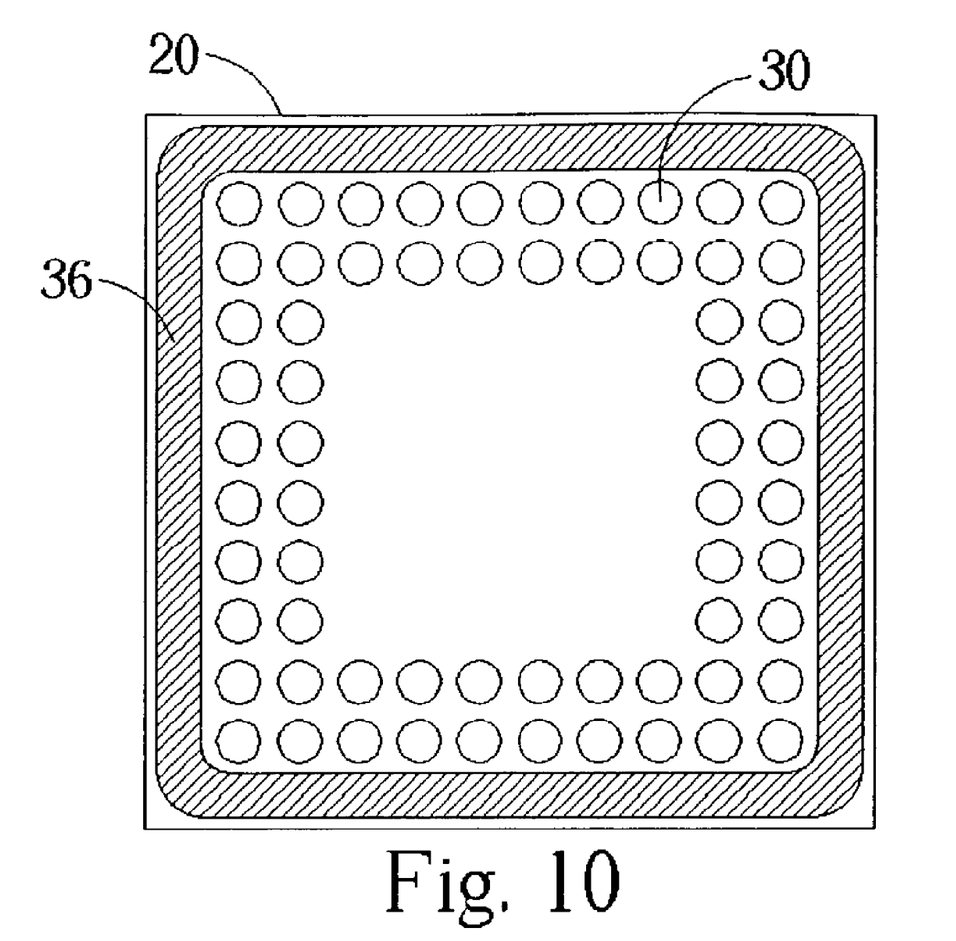
FIG. 10 is a bottom view of a fourth embodiment of the present invention.

A fourth embodiment of the present invention method is illustrated in FIG. 10, which shows a bottom view of the IC package 20. For clarity, the circuit board 22 is not shown in FIG. 10. A continuous strip of solder 36 is disposed along the perimeter of IC package 20 to mechanically connect the package 20 to the circuit board 22. The solder strip 36 can be produced at the same time and by the same device as the electrically connecting solder balls 30. No electrical connection between the package 20 and the circuit board 22 is provided by the solder strip 36. The exact length, diameter, location, and material of the strip of solder 36 are determined based on relevant design parameters, such as expected manufacturing or operating temperature range and external loading. Alternatively, the solder strip 36 need not be continuous and may have interruptions in its length.

In summary, the described method of attaching an IC package to a circuit board offers a strengthened mechanical connection. In contrast to the prior art, the present invention anchors support a sufficient share of a thermally induced or direct mechanical load, both of which may be simultaneous and cyclic, to prevent solder balls from becoming overstressed and cracking. This enhanced stiffness package attachment method will lead to less mechanical failures of solder balls.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method for attaching an integrated circuit (IC) package to a circuit board, the IC package having a plurality of electrical contacts, the plurality of electrical contacts being disposed on a major surface of the IC package in an arrangement having a perimeter, the method comprising:

positioning the IC package relative to the circuit board, such that the major surface of the IC package is adjacent to a major surface of the circuit board;

electrically connecting the IC package to the circuit board through the plurality of electrical contacts; and disposing at least one strip of solder between the major surface of the IC package and the major surface of the circuit board to mechanically attach the IC package to the circuit board;

wherein the strip of solder does not provide an electrical contact between the IC package and the circuit board.

2. The method of claim 1 wherein the strip of solder is disposed at a location outside of the perimeter of the plurality of electrical contacts.

3. The method of claim 2 wherein the major surface of the IC package has a rectangular shape, and the arrangement of the plurality of electrical contacts is a grid-like array.

4. The method of claim 3 wherein the strip of solder is disposed along four edges of the major surface of the IC package.

* * * * *